United States Patent
Pohle et al.

(10) Patent No.: US 11,800,627 B2
(45) Date of Patent: Oct. 24, 2023

(54) PROBE FOR MEASURING PLASMA PARAMETERS

(71) Applicant: Ruhr-Universität Bochum, Bochum (DE)

(72) Inventors: Dennis Pohle, Bochum (DE); Christian Schulz, Bochum (DE); Ilona Rolfes, Bochum (DE)

(73) Assignee: RUHR-UNIVERSITÄT BOCHUM, Bochum (DE)

( * ) Notice: Subject to any disclaimer, the term of this patent is extended or adjusted under 35 U.S.C. 154(b) by 494 days.

(21) Appl. No.: 17/255,034

(22) PCT Filed: Jun. 25, 2019

(86) PCT No.: PCT/EP2019/066914
§ 371 (c)(1),
(2) Date: Dec. 22, 2020

(87) PCT Pub. No.: WO2020/002379
PCT Pub. Date: Jan. 2, 2020

(65) Prior Publication Data
US 2021/0251067 A1    Aug. 12, 2021

(30) Foreign Application Priority Data

Jun. 26, 2018 (DE) .................. 102018115389.9

(51) Int. Cl.
*H05H 1/00* (2006.01)
*H01J 37/32* (2006.01)

(52) U.S. Cl.
CPC ..... *H05H 1/0037* (2013.01); *H01J 37/32935* (2013.01); *H01J 37/32972* (2013.01)

(58) Field of Classification Search
CPC ............ H05H 1/0037; H05H 1/0062; H01J 37/32935; H01J 37/32972; G01N 22/00
See application file for complete search history.

(56) References Cited

U.S. PATENT DOCUMENTS

| 7,192,505 B2 | 3/2007 | Roche et al. |
| 2002/0047543 A1 | 4/2002 | Sugai et al. |

(Continued)

FOREIGN PATENT DOCUMENTS

| DE | 102006014106 B3 | 8/2007 |
| DE | 102010055799 B3 | 10/2016 |
| KR | 101456542 | 10/2014 |

OTHER PUBLICATIONS

Oberrath ("Active Plasma Resonance Spectroscopy: A kinetic Functional Analytic Description", J. Oberrath and R.P. Brinkmann, Department for Electrical Engineering and Information Technologies, Ruhr University Bochum, D-44780 Bochum, Germany, arXiv: 1305.7253v3[physics.plasma-ph] Mar. 10, 2014) (Year: 2014).*

(Continued)

*Primary Examiner* — G. M. A Hyder
(74) *Attorney, Agent, or Firm* — Dority & Manning, P.A.

(57) ABSTRACT

A probe for measuring plasma parameters by means of active plasma resonance spectroscopy comprises an external coupling, a balun, an internal coupling, and a probe head. It is provided that the couplings, the balun, and the probe head are integrated in an electrically-insulating substrate cylinder, and the substrate cylinder has a layered structure made from multiple substrate layers along its rotational axis. In this way, a probe for measuring plasma parameters is provided which enables an improved measurement of the plasma parameters, wherein the plasma is influenced as little as possible during the measurement of the plasma parameters.

14 Claims, 7 Drawing Sheets

(56) References Cited

U.S. PATENT DOCUMENTS

Figure 1:
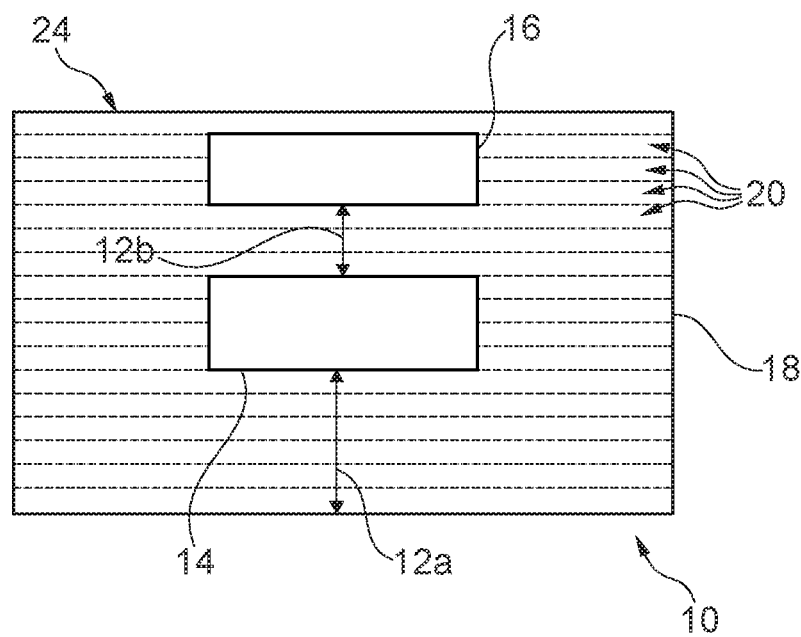

2013/0160523 A1* 6/2013 Brinkmann .......... H05H 1/0081
73/30.01
2022/0076933 A1* 3/2022 Scullin .............. H01J 37/32917

OTHER PUBLICATIONS

International Search Report (w/ English translation) PCT/EP2019/066914, dated Oct. 2, 2019, 6 pages.

Pohle, Dennis et al. "An Advanced High-Temperature Stable Multipole Resonance Probe for Industry Compatible Plasma Diagnostics", 2018 11$^{th}$ German Microwave Conference (GEMIC), IMA, Mar. 12, 2018, pp. 235-238.

Schulz, Christian et al. "The Planar Multipole Resonance Probe: Challenges and Prospects of a Planar Plasma Sensor", IEEE Transactions on Instrumentation and Measurement, IEEE Service Center, vol. 64, No. 4, Piscataway, NJ, US, Apr. 2015, pp. 857-864.

\* cited by examiner

PROBE FOR MEASURING PLASMA PARAMETERS

The invention relates to a probe for measuring plasma parameters by means of active plasma resonance spectroscopy.

Plasmas, that is, gaseous mixtures of neutral and charged components, are used in many technical areas. For example, they may be used to modify surfaces, for cleaning or sterilization processes, or when deposition processes are used in order to provide, for example, high precision coatings for optical applications. The specific characteristics of the plasma are thereby relevant for their technical use. Information about the state of the plasma may be determined via plasma parameters, like electron density, collision frequency, or electron temperature. For example, the electron temperature is a measure of the activity of the plasma, and the collision frequency provides information about the neutral gas composition. Exact knowledge about the plasma state is often essential for the success of a method that is based on the use of plasmas. The process may then be not only monitored but also controlled in order to achieve optimal successes. The determination of the plasma parameters is thus essential for the success of a method in many cases. There are correspondingly several methods for determining plasma parameters. However, only a few methods are industrially compatible. In order for a method to be industrially compatible, it must be robust against deposits and interferences, have the lowest possible cost, enable a measuring process and an evaluation at the least possible effort, not influence the plasma process due to the measuring process, and be suitable for real-time evaluation.

Probes for measuring plasma parameters by means of active plasma resonance spectroscopy are known in the prior art. In general, the probes have a probe head, which has a spherical shape. This probe design has advantages which result from the mathematical considerations of multipole expansion. Multipole expansion is a method which, in the presence of the conditions of separable coordinates, allows the explicit resolution of the mathematical relationships behind the equivalent circuit diagram, by which means a clear evaluation rule for determining the plasma parameters is obtained.

DE 10 2006 014 106 B3 discloses a device for measuring the density of a plasma, in which a resonance frequency is determined as a response to a high-frequency signal coupled into a plasma, and is used to calculate the plasma density. The device comprises a probe, which is insertable into the plasma, having a probe head in the form of a three-axis ellipsoid and means for coupling a high frequency into the probe head through a shaft holding the probe head.

DE 10 2010 055 799 B3 likewise discloses a device for measuring the density of a plasma. The device comprises a probe, which is insertable into the plasma, having a probe head in the form of two hemispherical electrode areas, and means for coupling a high frequency into the probe head through a shaft holding the probe head. The probe head has a sheath and a probe core surrounded by the sheath. The probe has a balun which is effective in the transition between the probe head and a high-frequency signal supply.

The introduction of a probe of the type described above into the plasma reactor for a measuring process generally means a disturbance for the plasma. The measuring process leads to a deformation of the plasma and may lead to the fact that deposits form behind the probe. The probe design described above may also not be arbitrarily downsized, because a reduction in size would reduce the robustness of the probe.

Arising from this, it is the object of the invention to provide a probe for measuring plasma parameters which enables an improved measurement of the plasma parameters, wherein the plasma should be influenced as little as possible during the measurement of the plasma parameters.

This problem is solved by the subject matter of patent claim 1. Preferred refinements are given in the subclaims.

According to the invention, a probe for measuring plasma parameters by means of active plasma resonance spectroscopy is specified, wherein the probe comprises an external coupling, a balun, an internal coupling, and a probe head, wherein the couplings, the balun, and the probe head are integrated into an electrically-insulating substrate cylinder, and the substrate cylinder has a layered structure made from multiple substrate layers along its rotational axis.

The probe for measuring plasma parameters by means of active plasma resonance spectroscopy according to the invention has an improved shape due to its structure, is particularly compact and robust, and permits industrial manufacturing using standard processes. The basic concept of the invention lies in integrating the individual components, like the couplings, the balun, and the probe head, into one component, the substrate cylinder, by which means the probe is made particularly robust. Due to the layered structure of the substrate cylinder, a space-saving integration of the individual components is achieved, by which means the probe is made particularly compact. The cylindrical shape of the substrate cylinder leads to the fact that the probe may be installed flush into a reactor wall, so that the plasma parameters may be measured with the least possible influence of the probe on the plasma.

Active plasma resonance spectroscopy enables the measurement of plasma parameters, like the electron density, the collision frequency, or the electron temperature. By this means, information may be ascertained about the state of the plasma. For example, the electron temperature is a measure of the activity of the plasma, and the collision frequency provides information about the neutral gas composition.

In active plasma resonance spectroscopy, a high-frequency signal in the gigahertz range is coupled into the plasma. The signal reflection is measured as a function of the frequency, the resonances are ascertained as a maximum of the absorption, or as a minimum of the input reflection factor, among others. The electrical coupling in of the high-frequency signal is very challenging, as the probe head has to be controlled symmetrically with the high-frequency signal. The symmetrical control basically requires that the supply lines likewise have to be designed electrically-symmetrically so that no phase shift results from the wiring arrangement. However, the implementation of this type of wiring arrangement is very complex. The balun is a component for converting between a symmetrical line system and an asymmetrical line system. The balun operates in both directions and permits the use of asymmetrical line feeds.

The substrate cylinder has the shape of a vertical, circular cylinder. The height of the substrate cylinder lies preferably between 3.5 and 4 mm. The diameter of the substrate cylinder lies preferably between 33 and 34 mm.

According to one preferred refinement of the invention, the external coupling, the balun, the internal coupling, and the probe head are arranged along the rotational axis of the substrate cylinder in the listed order in different substrate layers. The arrangement of the probe head close to the surface of the substrate cylinder is important for a successful measurement of the plasma parameters, as the probe head is located in the spatial vicinity of the plasma during the measurement due to this embodiment. As the balun enables the probe head to be controlled symmetrically with the high-frequency signal, it is advantageous if the balun is arranged as directly as possible upstream of the probe head, thus only the internal coupling lies between the probe head and the balun. In order to couple high frequency into the probe, the external coupling is located upstream of the balun. Correspondingly, a stacked structure of the components in the substrate cylinder is spatially advantageous. The structure may be implemented particularly easily if the individual components are arranged in different substrate layers. This has the additional advantage that the electrically-insulating substrate cylinder prevents undesired contact between the components.

According to one preferred refinement of the invention, the probe head comprises two metallic half-disks, insulated with respect to one another, and is separated from the surface of the substrate cylinder by at least one substrate layer. The metallic half-disks of the probe head are electrodes. They have an opposite electrical polarity during the measurement, so that they may establish an electrical field. They must be electrically insulated from one another for this purpose. In order to have no direct contact with the plasma during the measurement, the metallic half-disks are separated from the surface of the substrate cylinder by at least one substrate layer. The metallic half-disks are particularly preferably separated from the surface of the substrate cylinder by exactly one substrate layer. Thus, the metallic half-disks are protected from the plasma and simultaneously the spatial removal of the metallic half-disks from the plasma is low. The metallic half-disks have a diameter of preferably 3 to 5 mm. The diameter of the metallic half-disks may differ, depending on the application area of the probe. A probe head with metallic half-disks with a large diameter is preferably used for monitoring plasmas with low electron density and low resonance frequencies. A probe head with metallic half-disks with a small diameter is preferably used for monitoring plasmas with high electron density and high resonance frequencies.

According to one preferred refinement of the invention, the probe has at least one substrate layer between the probe head and the balun, wherein the probe head and the balun are contacted with one another via the internal coupling. Due to the integration of the individual components in the substrate cylinder, attention must be paid to the fact that the measurement is not influenced by over-coupling fields. In order to shield the probe head from an over-coupling field of the balun, and to shield the balun from an over-coupling field of the probe head, the probe has at least one substrate layer between the probe head and the balun. The probe preferably has 7 or 13 substrate layers between the probe head and the balun. This leads to a particularly good shielding and enables a compact structure of the probe despite this. In order to establish an electrical connection between the probe head and the balun, the probe head and the balun are contacted with one another via the internal coupling.

In order to enable a simplest coupling of high frequency into the probe, the probe according to one preferred refinement of the invention comprises a plug, wherein the plug and the balun are contacted with one another via the external coupling. The plug is preferably a plug for connecting a high-frequency line. This is particularly preferably a plug for a coaxial cable. A coaxial cable is an electrical high-frequency signal conductor and is generally shielded. Therefore, the coaxial cable essentially neither radiates nor absorbs energy, and therefore causes practically no interferences. The plug is located on the surface on the probe and is electrically contacted to the balun via the external coupling. The cable impedance of the plug, the external coupling, and the balun are designed so that they are adapted to the cable impedance of the upstream coaxial cable. For example, the cable impedance for the listed components is 50 ohms, and the cable impedance of the upstream coaxial cable is likewise 50 ohms.

According to one preferred refinement of the invention, the balun comprises two strip conductors running parallel to one another, wherein in each case, one end of the strip conductor is connected to the external coupling and the other end of the strip conductor is connected to the internal coupling, the strip conductors are separated from one another by at least one substrate layer, the first strip conductor is a measuring layer, the second strip conductor is signal layer, the first strip conductor has a changing width, and the strip conductors lie over one another in relation to the direction of the rotational axis of the substrate cylinder. The two strip conductors of the balun are connected to the couplings at their respective ends for the purpose of electrical contacting. The strip conductors run parallel to one another and are separated from one another by at least one substrate layer. They are preferably separated from one another by two substrate layers in order to achieve a good electrical insulation from one another. The first strip conductor, which is a measuring layer, has a changing width. The width of the first strip conductor is preferably large in the vicinity of the external coupling. The width of the first strip conductor additionally preferably decreases along the strip conductor in the direction of the probe head so that a trapezoidal geometry results for the first strip conductor. It is basically possible that the second strip conductor has a virtually unchanged width. Preferably, however, the second strip conductor also has a changing width. The two strip conductors lie over one another with respect to the direction of the rotational axis of the substrate cylinder in order to facilitate a compact structure.

According to one preferred refinement of the invention, the balun is a curved balun which comprises at least three, preferably four sections of different lengths, wherein the sections are connected at approximately right angles to one another so that the sections form the shape of a spiral, and the corners of the spiral are slanted. The shape of the curved balun offers the advantage that three of the four sections of the balun are spatially widely distanced from the probe head and thus the coupling with the probe head is reduced. Furthermore, the space is utilized particularly well, by which means a compact probe is realized. The slanting of the corners of the spiral, also designated as "mitered bends", leads to the fact that the additional capacity of the balun, caused by the virtually right-angled bends, is compensated, so that the line impedance remains unchanged in comparison to an uncurved balun. Due to this structure, the curved balun behaves virtually identically to an uncurved balun with otherwise identical parameters.

Alternatively, the balun is preferably a stacked, folded balun which comprises two sections running parallel to one another, wherein the two sections are separated from one another by at least one substrate layer, and are contacted with one another by a further coupling running parallel to the rotational axis of the substrate cylinder. Alternatively to the use of a curved balun designated as a "stacked, folded balun" may be used. This type of balun has the advantage that the structure is symmetrical and therefore the design process for the probe is substantially accelerated. However, this shape leads to an additional coupling of the sections of the balun lying above one another. Therefore, at least one substrate layer is located between the two sections. Eight substrate layers are preferably located between the two sections in order to achieve the best shielding and simultaneously to enable a compact structure. The two sections are electrically contacted with one another through a further coupling which runs parallel to the rotational axis of the substrate cylinder.

According to one preferred refinement of the invention, the couplings are feed-through connections which enable an electrical connection through the substrate layers. In order to electrically contact individual components, which are located in different substrate layers, with one another, the couplings are configured as feed-through connections. Feed-through connections, also designated as "vias" in English, enable a vertical connection through the electrically insulating substrate layers. Different types of feed-through connections may be used. The feed-through connection may, for example, reach only through one substrate layer. In case this substrate layer is an exterior substrate layer, then such a feed-through connection is designated as a "blind via". In case this substrate layer is enclosed by other substrate layers, then such a feed-through connection is designated as a "buried via". Alternatively, the feed-through connection may be configured so that two exterior substrate layers are connected to one another, which is designated as a "through hole via". It may be advantageous to provide multiple feed-through connections with an offset arrangement in each substrate layer, as a mismating or non-contacting may be excluded to the greatest extent in the context of the manufacturing.

According to one preferred refinement of the invention, the substrate cylinder is produced from at least one substrate material, preferably made from an LTCC ceramic, wherein the substrate material permits a multi-layered structure. A standard printed circuit board technology is preferably used as the substrate material for the substrate cylinder. The substrate material used should thereby enable a multi-layer structure, in which multiple substrate layers may be used over one another without undesired electrical contact occurring between the conductors. The conducting connections are first applied to the individual, electrically-insulating substrate layers, and subsequently multiple substrate layers, structured this way, are laid over one another, and connected to one another, for example through pressure or temperature, so that an individual piece that is no longer separable results. Glass fiber mats soaked in epoxy resin (for example, FR-4) have proven to be suitable substrate materials, and in particular, the Ro4003 substrate material suitable for high-frequency technologies. The substrate material is particularly preferably made from a material which may be used in the LTCC technologies. LTCC (low temperature cofired ceramics) is a technology for producing multi-layer switches, thus a substrate material which allows a multi-layer structure, based on sintered ceramic supports. The ceramic substrate materials used are characterized by high temperature stability. The use of LTCC ceramics leads to a particularly temperature-stable substrate cylinder, which may also be used for measurements in plasmas over 200° C. For example, DuPont 951 or Ferro A6M substrate materials are particularly suited for the production of the substrate cylinder. The use of a standard printed circuit board technology has the advantage that an inexpensive, reproducible, and industrial grade implementation is possible with high production accuracy.

The outermost substrate layer of the substrate cylinder may basically be made from the same substrate material as the other substrate layers. This enables a simple production of the probe. According to one preferred refinement of the invention, however, the outermost substrate layer on the side of the substrate cylinder, which is located closer to the probe head, consists of a different substrate material than the other substrate layers. The substrate layer on the side of the substrate cylinder which is located closer to the probe head is that substrate layer which contacts the plasma during a measurement. Therefore, it may be advantageous that this substrate layer consists of a different substrate material. For example, this substrate layer may be made of glass. The outermost substrate layer on the side of the substrate cylinder, which is located closer to the probe head, may also have a different thickness than the other substrate layers. Thus, this substrate layer may be adapted to the requirements of the measurement.

According to one preferred refinement of the invention, the substrate cylinder is fitted into a hollow cylinder made from metal, and the side of the substrate cylinder, which is located closer to the probe head, is terminated flush with an upper edge of the hollow cylinder. The substrate cylinder may, for example, be enclosed in the hollow cylinder using adhesive or solder. The inner diameter of the hollow cylinder is large enough that the substrate cylinder may be enclosed flush in the hollow cylinder. It may thereby be advantageous if the inner side of the hollow cylinder has an offset, wherein the substrate cylinder contacts the offset edge of this offset. The inner diameter of the hollow cylinder is preferably 33 to 34 mm without offset, and 32 to 33 mm with offset. This results in an offset edge, on which the substrate cylinder contacts, of preferably 1 mm. The wall thickness of the hollow cylinder preferably lies between 2 and 3 mm. The outer diameter of the hollow cylinder is particularly preferably designed so that the probe may be fitted into a standard flange, for example, into a KF40 flange. This enables the accommodation of the probe in the reactor wall, so that the plasma is influenced as little as possible by the measurement process. The hollow cylinder made from metal has a height between 30 and 40 mm. As the substrate cylinder connects flush with the upper edge of the hollow cylinder on the side of the probe head and the height of the hollow cylinder is greater than the height of the substrate cylinder, the hollow cylinder projects past the side of the external coupling. This enables that the connection to the probe, which is carried out, for example, using a plug, is protected by the hollow cylinder. The connection therefore does not have to have a high temperature stability, as the connection is not located within the reactor chamber during the measurement due to its location within the hollow cylinder. The encasing of the substrate cylinder in the hollow cylinder made from metal also leads to the fact that the reactor chamber may already be sealed at the flange by the attachment of the probe. Thus, an additional vacuum feed through, for a cable for example, which is attached to the connection of the probe, may be omitted.

It was stated above that the probe head according to one preferred refinement of the invention comprises two metallic half-disks insulated with respect to one another. According to one preferred embodiment, these half-disks are planar. Alternatively, these half-disks may be designed as curved, preferably with a curvature on a cylindrical or spherical surface. The half-disks may thereby be applied on the one hand to a stiff, curved substrate or to a flexible, bendable substrate. In this way, the sensor may be adapted beforehand to a certain radius of curvature of the target substrate or may be flexibly readjusted for different radii. In both cases, the curved probe head may be considered as a conformal antenna. A flexible, curved sensor has the advantage that it may be adapted, even after production, to any arbitrary cylindrical or spherical target shape with virtually any radius of curvature. Thus, the same probe is usable, for example, for different flange sizes. Due to this flexibility of shape, the flexible sensor is additionally suited for planar substrates. In the case of a rigid design, a curved substrate holder may be produced by means of 3D printing or CNC machining. The metallic half-disks are subsequently applied either directly to the substrate holder, e.g., using a sprayed on metallic coating (e.g. silver lacquer), or they are printed by means of a standard method onto a flexible HF substrate, which is glued to the substrate holder. An additional metallic adapter ring may be located directly downstream of the probe head substrate and may be used for impedance adjustment. A metallic cylinder may function as a holder and positioning means for the probe head and may be inserted through a flange of the reactor. Both the adapter ring and also the cylinder may have the same radius of curvature on the side of the probe head as the probe head, so that everything connects flush with one another. In the case of a flexible design, the metallic half-disks may be printed on a flexible HF substrate using standard technologies. The probe head substrate is subsequently glued to a flexible adapter ring, which consists of a foamed material and whose surface has been coated with metal, and/or the material itself is metallic or has conductive inclusions. Due to this flexibility of the shape adaptability, it is achieved that the probe head may adjust to the shape of the target substrate. A simple hollow, metal cylinder with a supporting edge may be used as a holder for the foamed material adapter ring.

The invention is subsequently described by way of example on the basis of a preferred embodiment with reference to the drawings.

Figure 2:
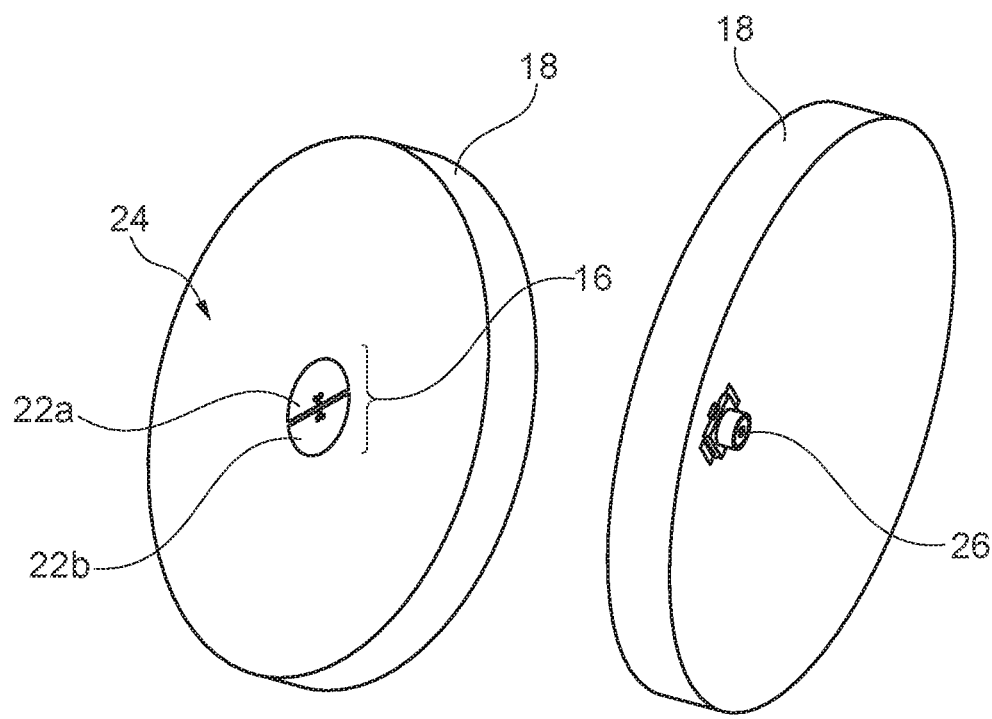
Figure 3:
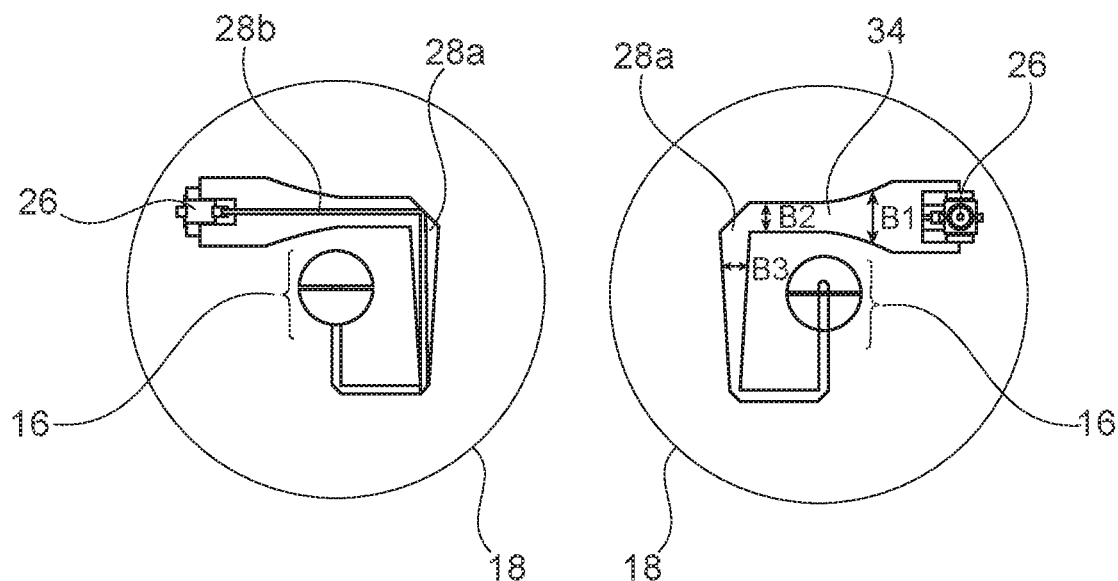
Figure 4:
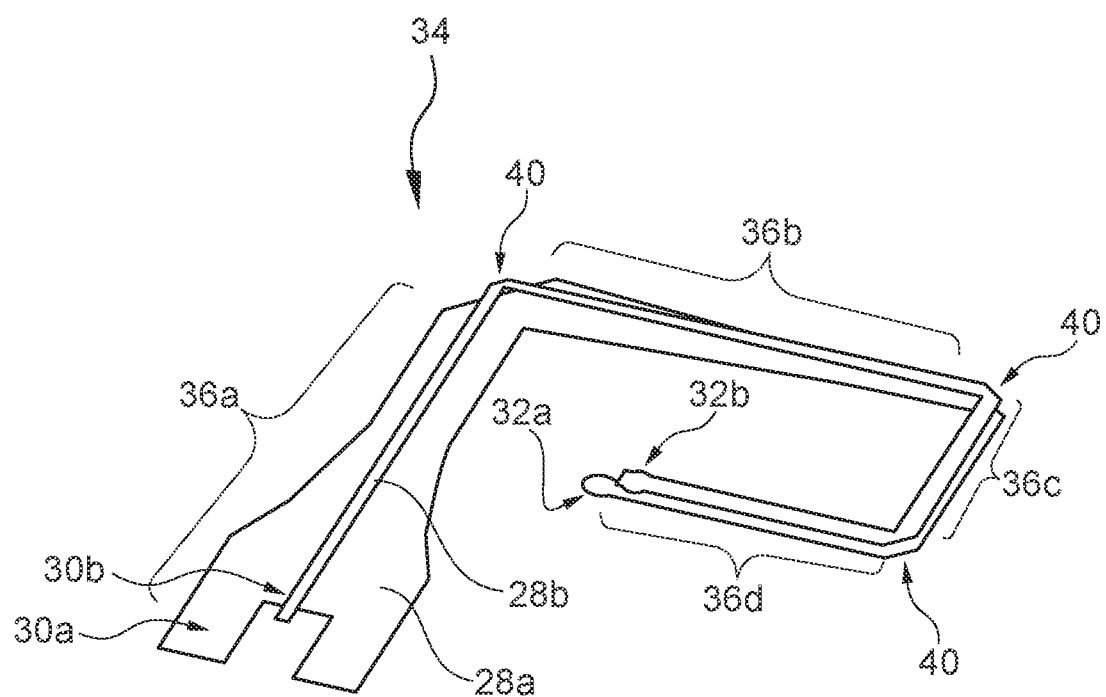
Figure 5:
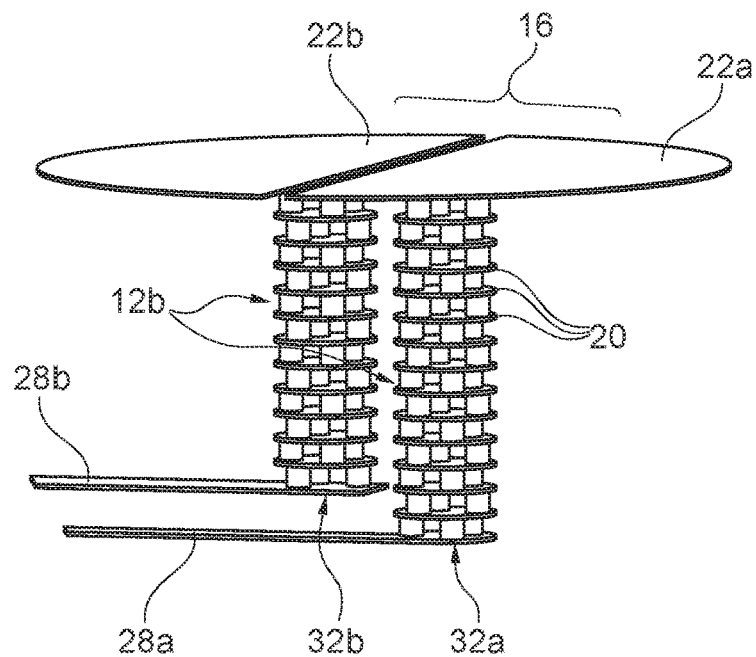
Figure 6:
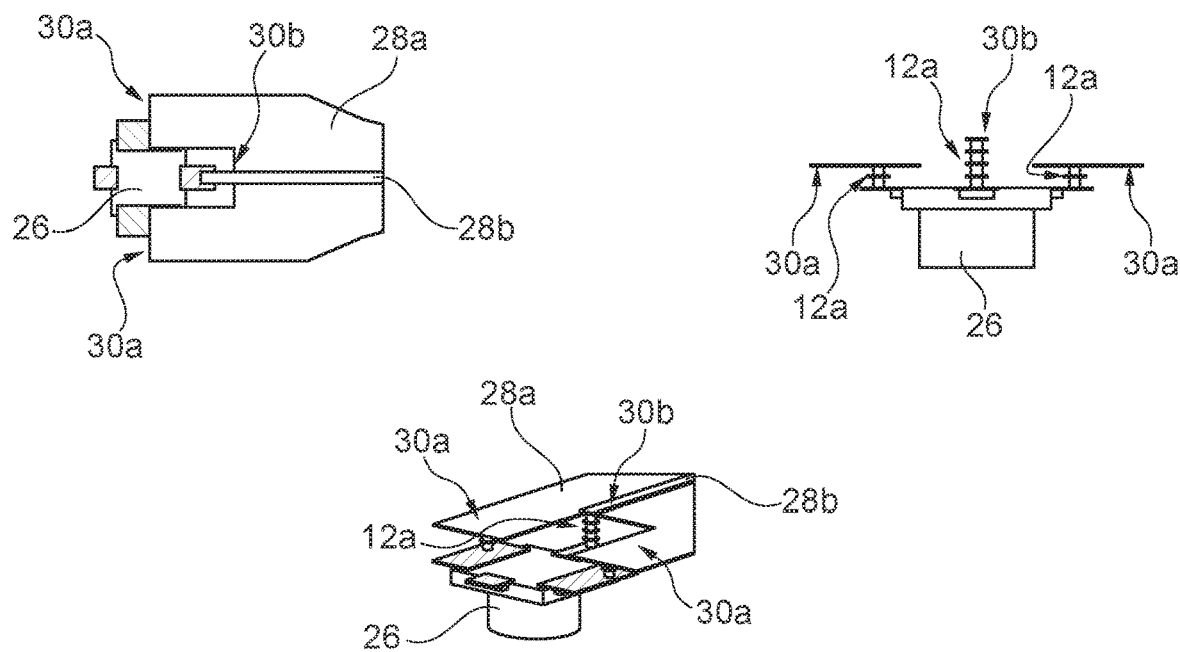
Figure 7:
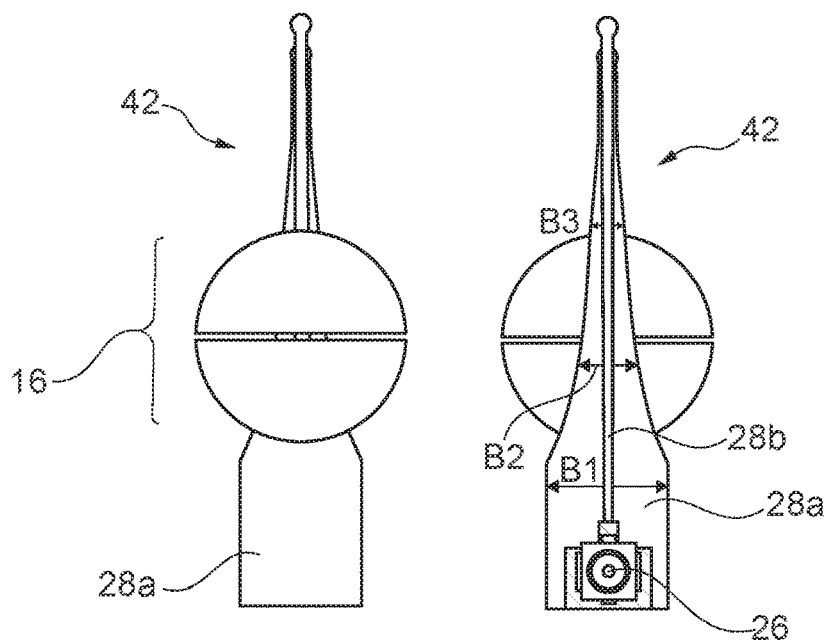
Figure 8:
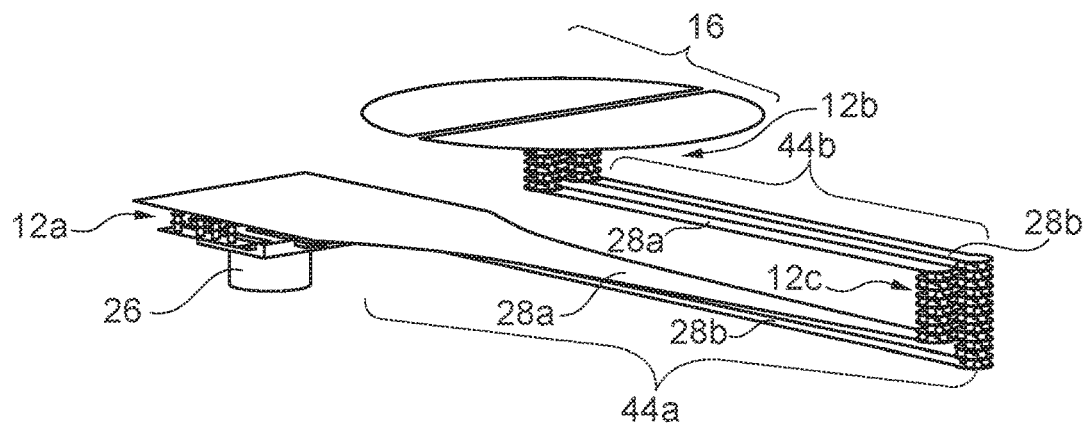
Figure 9:
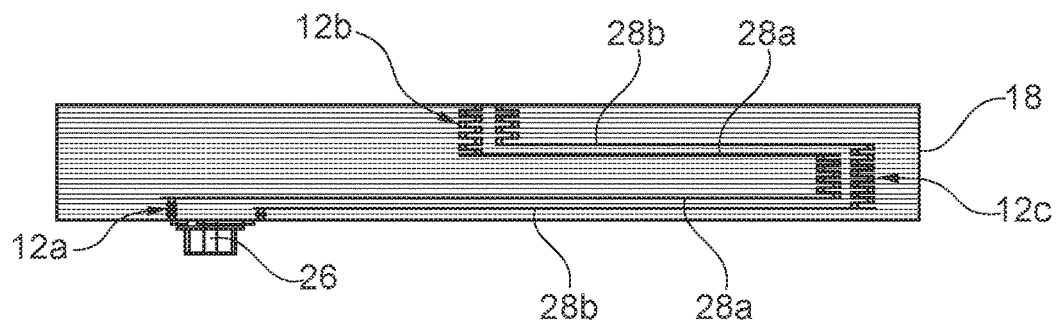
Figure 10:
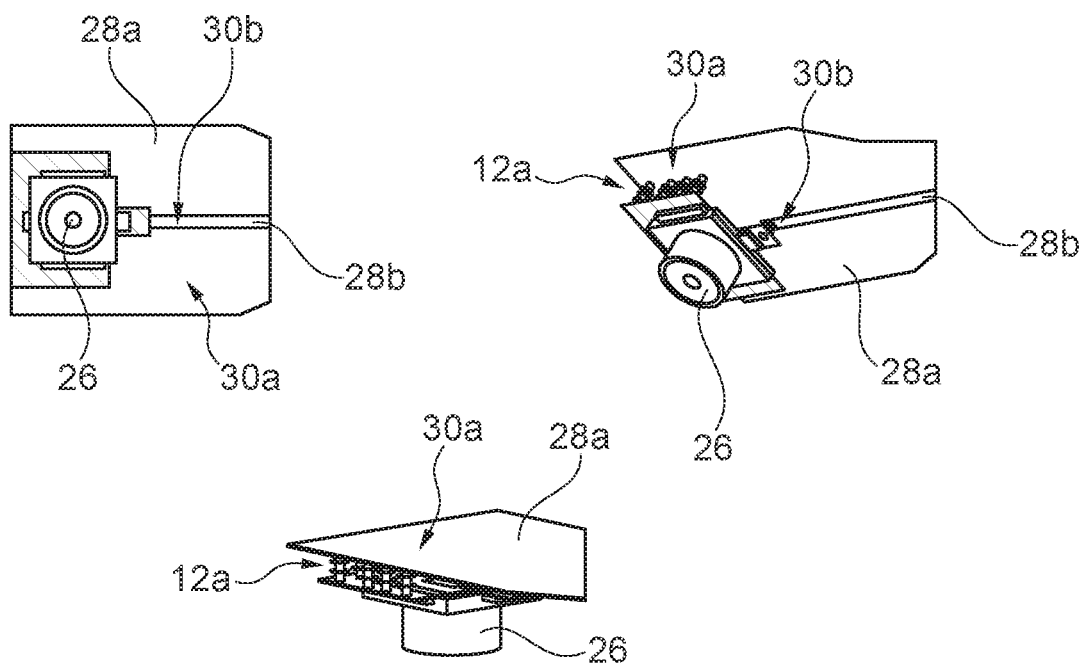
Figure 11:
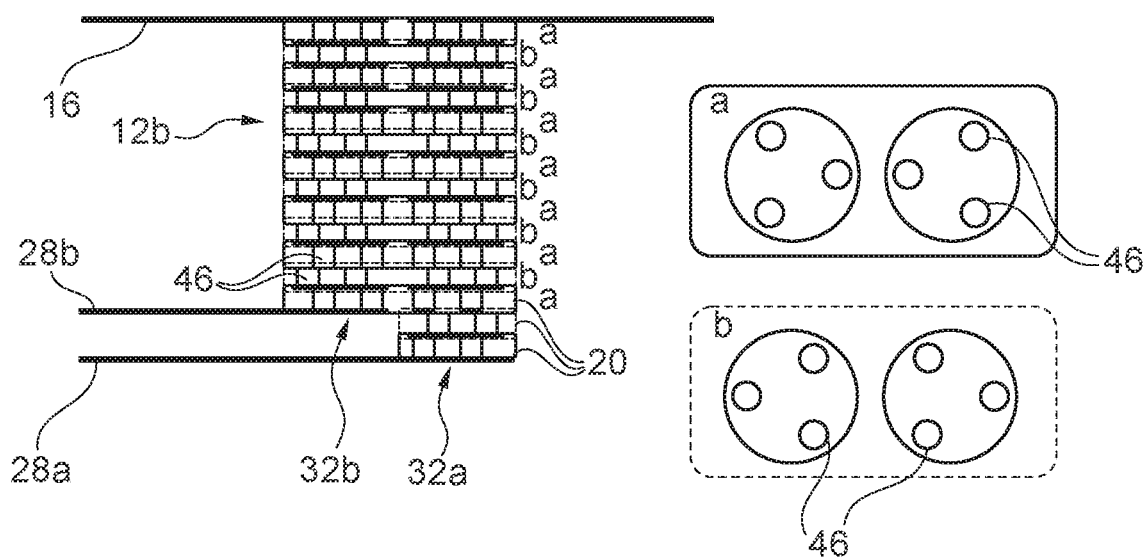
Figure 12:
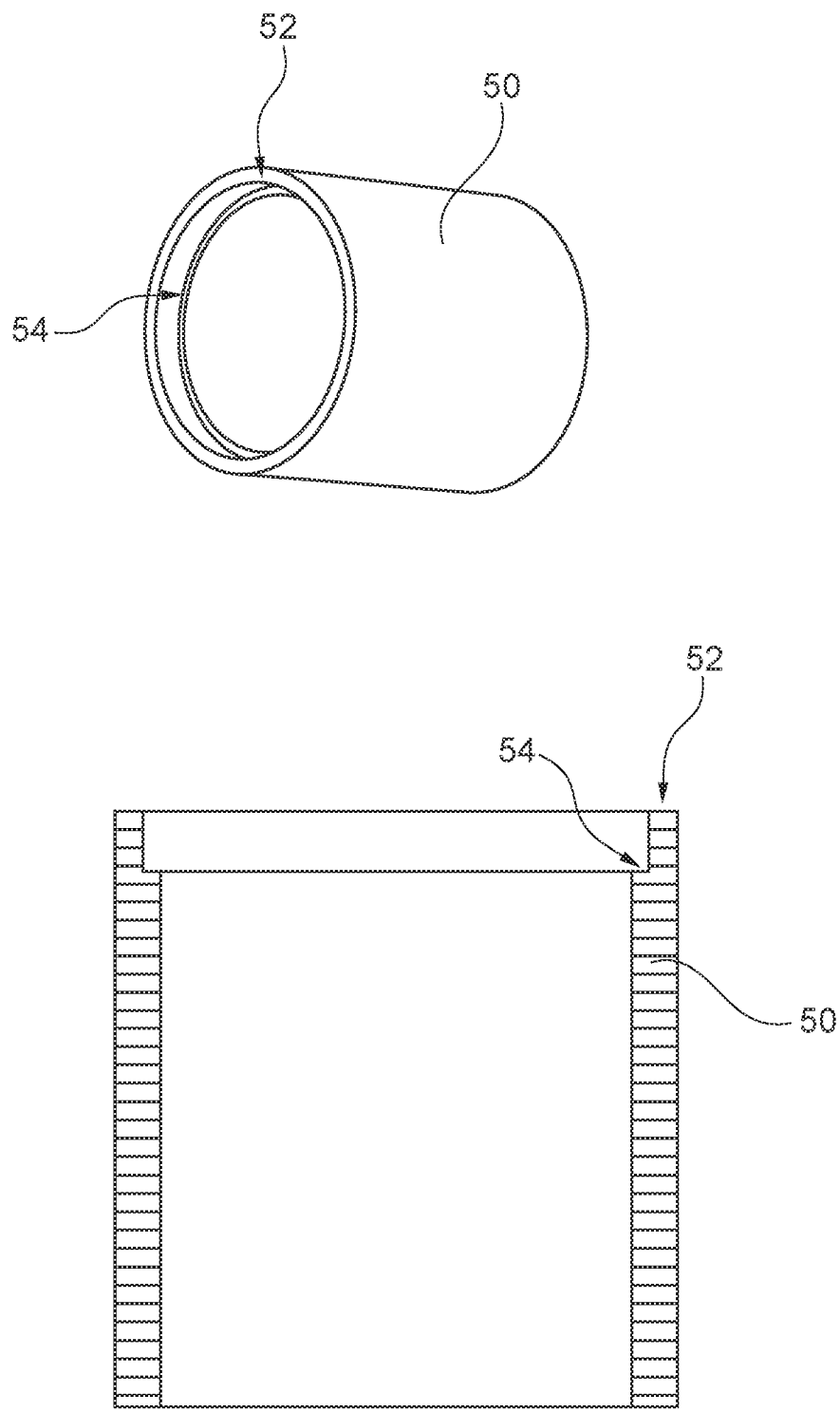
Figure 13:
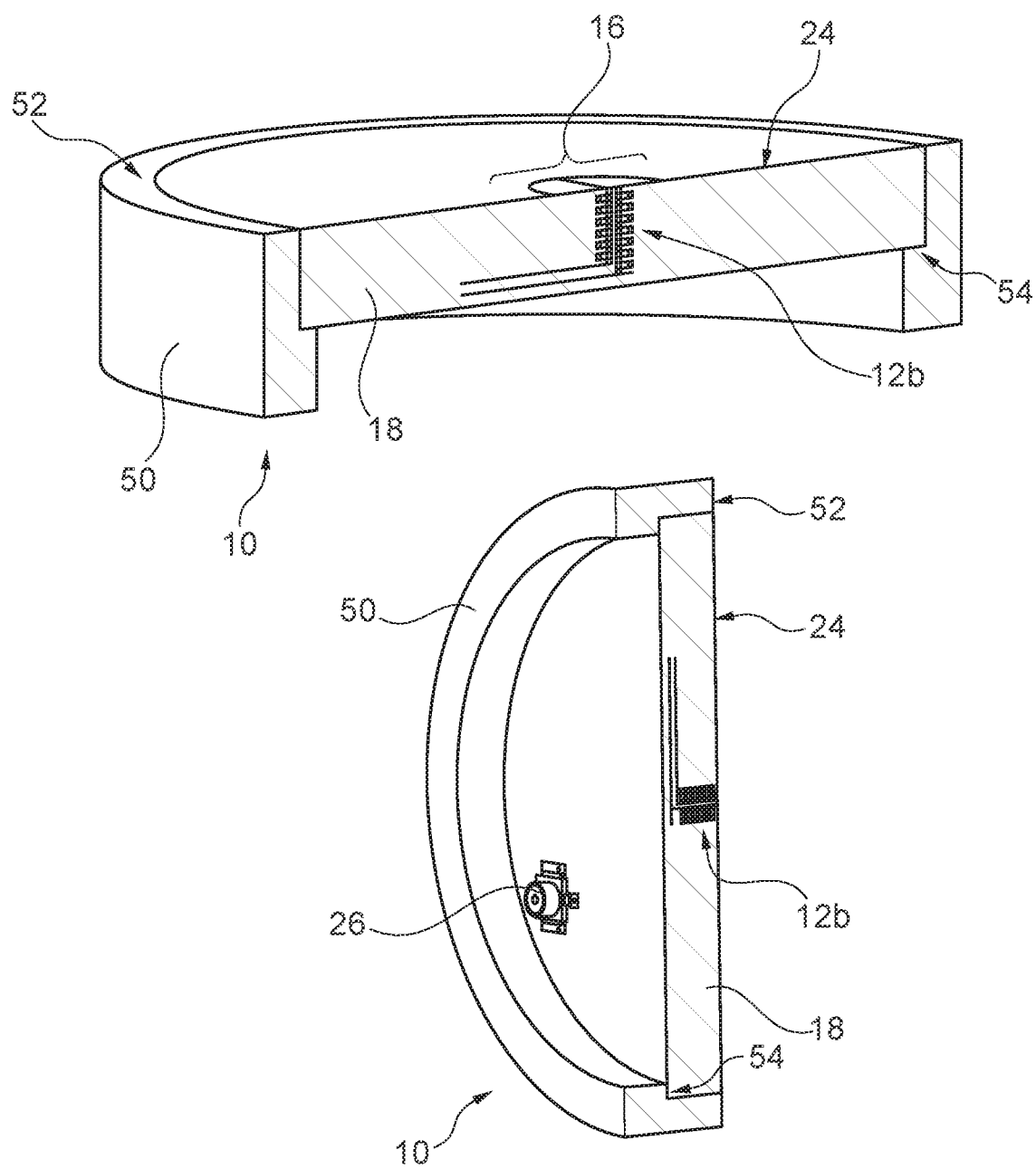

As show in the drawings:

FIG. 1 a schematic depiction of a probe according to one preferred embodiment of the invention, FIG. 2 a perspective depiction of a substrate cylinder according to one preferred embodiment of the invention, FIG. 3 a schematic depiction of a balun in a first embodiment, together with the substrate cylinder, a probe head, and a plug, FIG. 4 a perspective depiction of the balun in a first embodiment, FIG. 5 a perspective depiction of a coupling of the probe head to the balun in a first embodiment, FIG. 6 schematic and perspective depictions of a coupling of the plug to the balun in a first embodiment, FIG. 7 a schematic depiction of a balun in a second embodiment, together with the probe head and the plug, FIG. 8 a perspective depiction of the balun in a second embodiment, together with the probe head and the plug, FIG. 9 a schematic depiction of the balun in a second embodiment, together with the probe head and the plug, FIG. 10 schematic and perspective depictions of the coupling of the plug to the balun in a second embodiment, FIG. 11 a schematic depiction of a feed-through connection according to one preferred embodiment, FIG. 12 a perspective and a schematic depiction of a hollow cylinder according to one preferred embodiment, and FIG. 13 two perspective depictions of the probe according to one preferred embodiment.

FIG. 1 schematically shows the structure of a probe 10. An external coupling 12a, a balun 14, an internal coupling 12b, and a probe head 16 are located within a substrate cylinder 18. Substrate cylinder 18 has a layered structure made from multiple substrate layers 20 along its rotational axis. The probe head in this preferred embodiment is separated from a surface 24 of the substrate cylinder by a substrate layer 20.

FIG. 2 shows two perspective depictions of substrate cylinder 18, whereby the side of the substrate cylinder with probe head 16 is visible in FIG. 2a, and the opposite side with a plug 26 is visible in FIG. 2b. Probe head 16 comprises two metallic half-disks 22a and 22b. The substrate cylinder has, on the side opposite the probe head, plug 26 for connecting the probe to a coaxial cable.

Two embodiments are possible for balun 14. Depending on the embodiment of balun 14, the configuration of external coupling 12a is adapted to balun 14 and the configuration of internal coupling 12b is adapted to probe head 16. FIGS. 3, 4, 5, and 6 relate to the first embodiment; FIGS. 7, 8, 9, and 10 relate to the second embodiment.

FIGS. 3 and 4 show balun 14 in a first embodiment as a curved balun 34. Additionally, substrate cylinder 18, plug 26, and probe head 16 are also illustrated in FIG. 3. Curved balun 34 has two strip conductors 28a and 28b, wherein first strip conductor 28a has a changing width B1, B2, B3. Strip conductors 28a, 28b are contacted at their respective one end 30a, 30b with plug 26 via external coupling 12a, and at their respective other ends 32a, 32b with probe head 16 via internal coupling 12b. Curved balun 34 comprises four sections 36a, 36b, 36c, 36d which are connected to one another such that they form the shape of a spiral 38. Corners 40 of spiral 38 are slanted.

In the first embodiment, the coupling of balun 14 to probe head 16 is depicted in FIG. 5 as a curved balun 34. FIG. 5 shows a perspective depiction of probe head 16 with internal coupling 12b at balun 14, wherein balun 14 is not completely depicted. Probe head 16 is distanced from balun 14 by 13 substrate layers 20 in this case and contacted with it via internal coupling 12b. Balun 14 comprises a first strip conductor 28a, which is contacted at its end 32a via internal coupling 12b to metallic half-disk 22a of probe head 16. Second strip conductor 28b of balun 14 is contacted at its end 32b via internal coupling 12b to second metallic half-disk 22b of the probe head. Two strip conductors 28a and 28b are distanced from one another by two substrate layers 20.

FIG. 6 shows three perspective depictions of plug 26, external coupling 12a, and balun 14 in the first embodiment, whereby balun 14 is not completely depicted. Balun 14 in the first embodiment has two strip conductors 28a and 28b, which are contacted at their respective one end 30a and 30b with plug 26 via external coupling 12a. First strip conductor 28a is distanced from plug 26 by two substrate layers 20. It has a recess on its end 30a, so that end 30a of first strip conductor 28a is configured as U-shaped. Two arms of the U-shape are contacted with plug 26 via external coupling 12a. Second strip conductor 28b of balun 14 is distanced from plug 26 by four substrate layers. Its end 30b lies in the center above the recess of first strip conductor 28a and is contacted with plug 26 via external coupling 12a. First and second strip conductors 28a and 28b are distanced from one another by two substrate layers 20.

Balun 14 is shown in FIG. 7, FIG. 8, and FIG. 9 in the second embodiment as a stacked, folded balun 42. Additionally, plug 26 and probe head 16 are also illustrated in FIG. 7 and FIG. 8, and substrate cylinder 18 in FIG. 9. Stacked, folded balun 42 has two strip conductors 28a and 28b, wherein first strip conductor 28a has a changing width B1, B2, B3. Strip conductors 28a, 28b are contacted at their respective end 30a, 30b with plug 26 via external coupling 12a, and at their respective other ends 32a, 32b with probe head 16 via internal coupling 12b. Stacked, folded balun 42 comprises two sections 44a, 44b, which are contacted with one another via an internal coupling 12c. Eight substrate layers are located between first strip conductor 28a of first section 44a and first strip conductor 28a of second section 44b. Twelve substrate layers are located between second strip conductor 28b of first section 44a and second strip conductor 28b of second section 44b. First and second strip conductors 28a and 28b are separated from one another by two substrate layers 20. The probe head is distanced from first strip conductor 28a of second section 44b by nine substrate layers 20 and from second strip conductor 28b of second section 44b by seven substrate layers 20.

FIG. 10 shows three perspective depictions of plug 26, external coupling 12a, and balun 14 in the second embodiment, whereby balun 14 is not completely depicted. Balun 14 in the second embodiment has two strip conductors 28a and 28b, which are contacted at their respective ends 30a and 30b with plug 26 via external coupling 12a. First strip conductor 28a is distanced from plug 26 by four substrate layers 20. Its end 30a is configured to be rectangular and is contacted with plug 26 via external coupling 12a. Second strip conductor 28b of balun 14 is distanced from plug 26 by two substrate layers. Its end 30b is contacted with plug 26 via external coupling 12a. First and second strip conductors 28a and 28b are distanced from one another by two substrate layers 20.

All couplings 12a, 12b, 12c shown establish the electrical contact via a feed-through connection 46, which is schematically shown in FIG. 11. Feed-through connections 46 are present in two arrangements (a, b). The arrangements a and b alternate in each substrate layer 20. Thus, feed-through connections 46 are arranged offset to one another in the individual substrate layers. FIG. 11 illustrates this by example of internal coupling 12b to probe head 16. The structure of feed-through connections 46 also applies to all couplings 12a, 12b, and 12c.

FIG. 12 shows a perspective and a schematic depiction of a hollow cylinder 50. Hollow cylinder 50 has an offset on an inner wall in the vicinity of an upper edge 52, wherein the substrate cylinder lies on an offset edge 54 of this offset.

FIG. 13 shows two perspective depictions of probe 10. Substrate cylinder 18 is thus fitted into hollow cylinder 50 such that upper edge 52 of hollow cylinder 50 terminates flush with surface 24 on one side of substrate cylinder 18. This is the side of substrate cylinder 18 where probe head 16 is located. Substrate cylinder 18 contacts offset edge 54 of hollow cylinder 50. Hollow cylinder 50 is taller than the substrate cylinder and projects past that side of substrate cylinder 18 where plug 26 is located. Internal coupling 12b, which contacts balun 14 with probe head 16, is likewise also depicted in FIG. 13.

The invention underlying this patent application emerged in a project which was supported by the Federal Ministry of Education and Research under grant number 13N13212.

LIST OF REFERENCE NUMERALS

10 Probe
12a External coupling
12a Internal coupling
12c Further coupling
14 Balun
16 Probe head
18 Substrate cylinder
20 Substrate layer
22a,b Metallic half-disk
24 Surface of the substrate cylinder 18
26 Plug
28a First strip conductor, measuring layer
28b Second strip conductor, signal layer
30a,b End of the strip conductors
32a,b Other end of the strip conductors
34 Curved balun
36a,b,c,d Sections
38 Spiral
40 Corners
42 Stacked, folded balun
44a,b Sections
46 Feed-through connection
48 Substrate material
50 Hollow cylinder
52 Upper edge
54 Offset edge

The invention claimed is:

1. A probe for measuring plasma parameters by means of active plasma resonance spectroscopy, wherein the probe comprises an external coupling, a balun, an internal coupling, and a probe head, wherein
the couplings, the balun, and the probe head are integrated in an electrically-insulating substrate cylinder, and the substrate cylinder has a layered structure made from multiple substrate layers along its rotational axis.

2. The probe according to claim 1, wherein
the external coupling, the balun, the internal coupling, and the probe head are arranged along the rotational axis of the substrate cylinder in the listed order in different substrate layers.

3. The probe according to claim 1, wherein
the probe has at least one substrate layer between the probe head and the balun, and the probe head and the balun are contacted with one another via the internal coupling.

4. The probe according to claim 1, wherein
the probe comprises a plug, wherein the plug and the balun are contacted with one another via the external coupling.

5. The probe according to claim 1, wherein
the balun comprises two strip conductors running parallel to one another, wherein in each case, one end of the strip conductor is connected to the external coupling and the other end of the strip conductor is connected to the internal coupling, the strip conductors are separated from one another by at least one substrate layer, the first strip conductor is a measuring layer, the second strip conductor is signal layer, the first strip conductor has a changing width, and the strip conductors lie over one another in relation to the direction of the rotational axis of the substrate cylinder.

6. The probe according to claim 1, wherein
the balun is a curved balun which comprises at least three sections of different lengths, wherein the sections are connected at approximately right angles to one another so that the sections form the shape of a spiral, and the corners of the spiral are slanted.

7. The probe according to claim 1, wherein
the balun is a stacked, folded balun which comprises two sections running parallel to one another, wherein the two sections are separated from one another by at least one substrate layer, and are contacted with one another by a further coupling running parallel to the rotational axis of the substrate cylinder.

8. The probe according to claim 1, wherein
the are feed-through connections which enable an electrical connection through the substrate layers.
9. The probe according to claim 1, wherein
the substrate cylinder is produced from at least one substrate material made from an LTCC ceramic, wherein the substrate material permits a multi-layered structure.
10. The probe according to claim 1, wherein
the outermost substrate layer on the side of the substrate cylinder, which is located closer to the probe head, consists of a different substrate material than the other substrate layers.
11. The probe according to claim 1, wherein
the substrate cylinder is fitted into a hollow cylinder made from metal, and the side of the substrate cylinder, which is located closer to the probe head, is terminated flush with an upper edge of the hollow cylinder.
12. The probe according to claim 1, wherein
the probe head comprises two metallic half-disks, insulated with respect to one another, and is separated from the surface of the substrate cylinder by at least one substrate layer.
13. The probe according to claim 12,
wherein the half-disks are planar.
14. The probe according to claim 12,
wherein the half-disks are curved onto a cylindrical or spherical surface.

* * * * *